United States Patent [19]
Hwang

[11] Patent Number: 5,616,438
[45] Date of Patent: Apr. 1, 1997

[54] RETICLE AND A METHOD FOR MEASURING BLIND SETTING ACCURACY USING THE SAME

[75] Inventor: Joon Hwang, Bubaleub, Rep. of Korea

[73] Assignee: Hyundai Electronics Industries Co., Ltd., Rep. of Korea

[21] Appl. No.: 415,720

[22] Filed: Apr. 3, 1995

[30] Foreign Application Priority Data

Apr. 1, 1994 [KR] Rep. of Korea ..................... 1994-6957

[51] Int. Cl.[6] ..................................................... G03F 9/00
[52] U.S. Cl. ................................ 430/5; 430/22; 356/400; 356/401
[58] Field of Search .......................... 430/5, 22; 356/400, 356/401

[56] References Cited

U.S. PATENT DOCUMENTS 5,444,538  8/1995  Pellegrini ................................ 356/401

*Primary Examiner*—S. Rosasco
*Attorney, Agent, or Firm*—Merchant, Gould, Smith, Edell, Welter & Schmidt

[57] ABSTRACT

A method for setting the blind of a stepper comprising the steps of: forming a first pattern which is made on a wafer by said blind, and a second pattern which is made on the wafer by chrome patterns of a reticle; comparing said first pattern with said second pattern; and measuring a setting error of said blind from the difference between said first pattern and second pattern.

6 Claims, 3 Drawing Sheets

RETICLE AND A METHOD FOR MEASURING BLIND SETTING ACCURACY USING THE SAME

BACKGROUND OF THE INVENTION

1. Field of the Invention

The present invention relates to a reticle which is capable of measuring a setting error of the blind of a stepper, and to a method for measuring blind setting accuracy.

2. Description of the Prior Art

In general, in contact printing, a mask is in contact with a photoresist layer, which causes the mask to become defective by repeatedly using the mask.

A projection printing is usually used to solve the problem. The projection printing can be used repeatedly without damaging the mask because the mask is not in contact with the photoresist layer.

In the projection printing, the mask may include a plurality of discrete circuits, or may include only a partial circuit of a configuration. In the case where the mask includes only a partial circuit, an image of the pattern formed on the mask is transmitted to the wafer by the step-and-repeat process of the stepper. In that case, the mask is called a reticle and, a blind is usually used to shield exposing light on a predetermined portion of the wafer. In that case, a reticle capable of measuring the blind setting accuracy is desired in order to detect an error caused by the difference between the blind and the pattern on the mask.

Referring to FIG. 1, a conventional reticle for measuring a blind setting accuracy will be described. FIG. 1 is a plan view illustrating the reticle having conventional verniers to measure a setting error of the blind of a stepper.

As shown in FIG. 1, a plurality of linear chrome patterns 2, which are square-shaped, are formed on a quartz substrate 1. Two or three verniers 3 are formed on each of the sides of the square-shaped patterns. The length of the sides of square-shaped patterns are typically 5 mm, 10 mm or 15 mm.

However, the conventional reticle for measuring the blind setting accuracy requires detecting every vernier, which has the problem of low production efficiency and the like.

SUMMARY OF THE INVENTION

Therefore, an object of the present invention is to solve the forementioned problems encountered in the prior art and to provide a reticle which is capable of measuring the setting error of the blind of a stepper.

Another object of the present invention is to provide a method for easily measuring the blind setting accuracy by monitoring only linear patterns formed on a wafer.

In accordance with the present invention, this object can be accomplished by a reticle for measuring the blind of a stepper, which reticle comprises a plurality of linear patterns whose centers are all the same and which have the same shape as said blind has by exposing a photoresist layer, whereby a pattern formed by said blind is compared with patterns formed by said reticle.

Also, this object can be accomplished by a method for setting the blind of a stepper, which comprises the steps of: forming a first pattern which is made on a wafer by said blind, and a second pattern which is made on the wafer by chrome patterns of a reticle; comparing said first pattern with said second pattern; and measuring a setting error of said blind from the difference between said first pattern and second pattern.

The above and other objects and advantages of the present invention will become more apparent from the following description.

To accomplish the foregoing and related objectives, the invention comprises the features hereinafter fully described in the specification and particularly pointed out in the claims. The description and annexed drawings set forth in detail a certain illustrative embodiment of the invention, which embodiment is indicative of but only one of the various ways in which the principles of the invention may be employed.

DETAILED DESCRIPTION OF THE INVENTION

Hereinafter, a preferred embodiment of the present invention will be described in detail with reference to FIG. 2 and FIGS. 3A to 3C.

Figure 1:
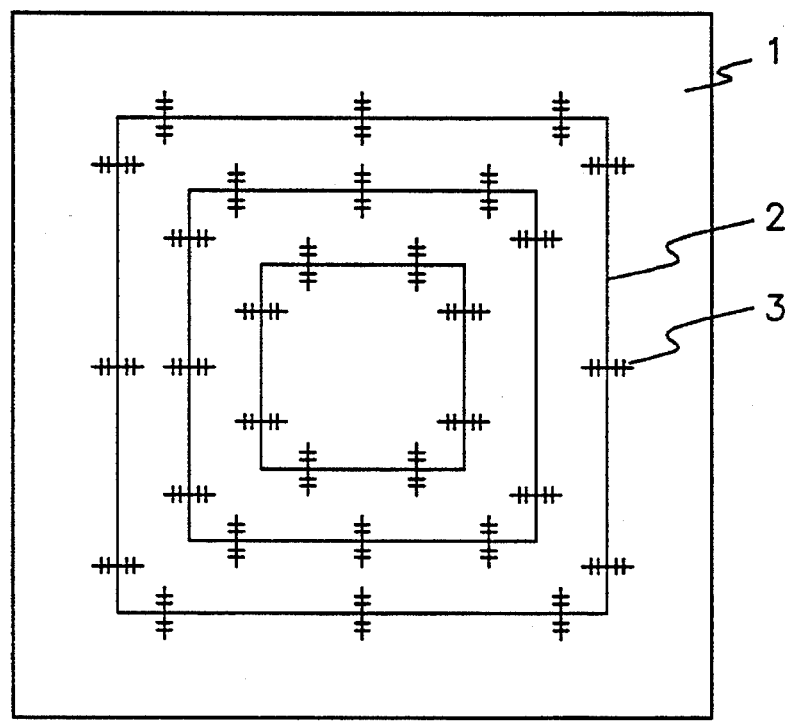
FIG. 1 is a plan view illustrating a conventional reticle having verniers to measure a setting error of the blind of a stepper.
Figure 2:
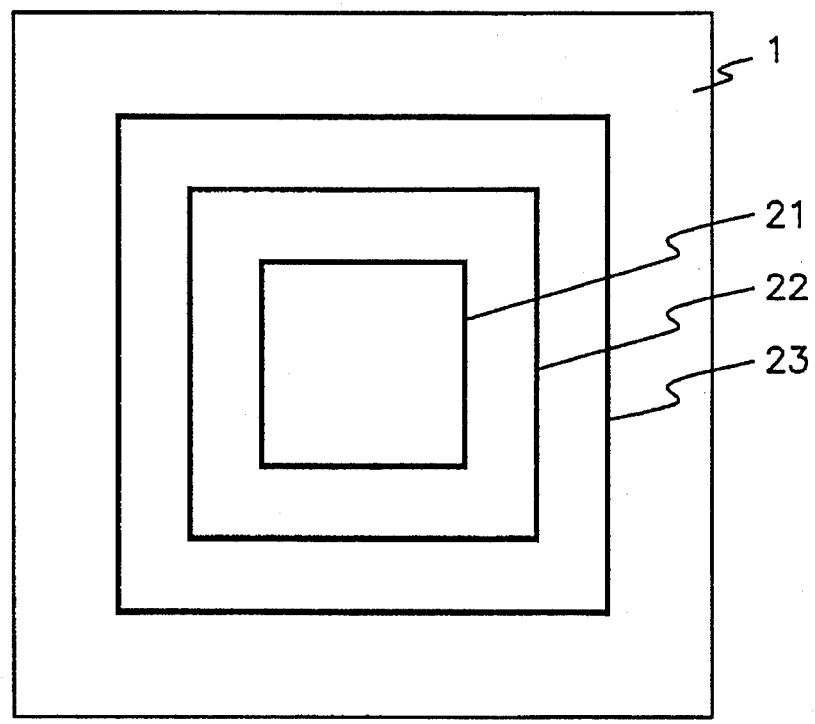
FIG. 2 is a plan view illustrating a reticle having linear patterns to measure a setting error of the blind of a stepper according to the present invention.

Referring to FIG. 2, there are three chrome patterns 21, 22, and 23 on a quartz substrate 1, which patterns are made of uniform line width and whose centers are all the same. The three chrome patterns 21, 22, and 23 are all the same shape as that which the blind makes in a process exposing a photoresist layer. Line width of these chrome patterns 21, 22, and 23 is formed to a length of 10 μm to 200 μm according to the blind setting accuracy of the stepper and the blind setting for scarifying the characteristics of a device. The chrome patterns 21, 22, and 23 vary in size in accordance with the size of the maximum exposure field of the stepper. In the embodiment of the present invention, the length of the chrome patterns 21, 22 and 23 are 5 mm, 10 mm, and 15 mm, respectively.

Figure 3A:
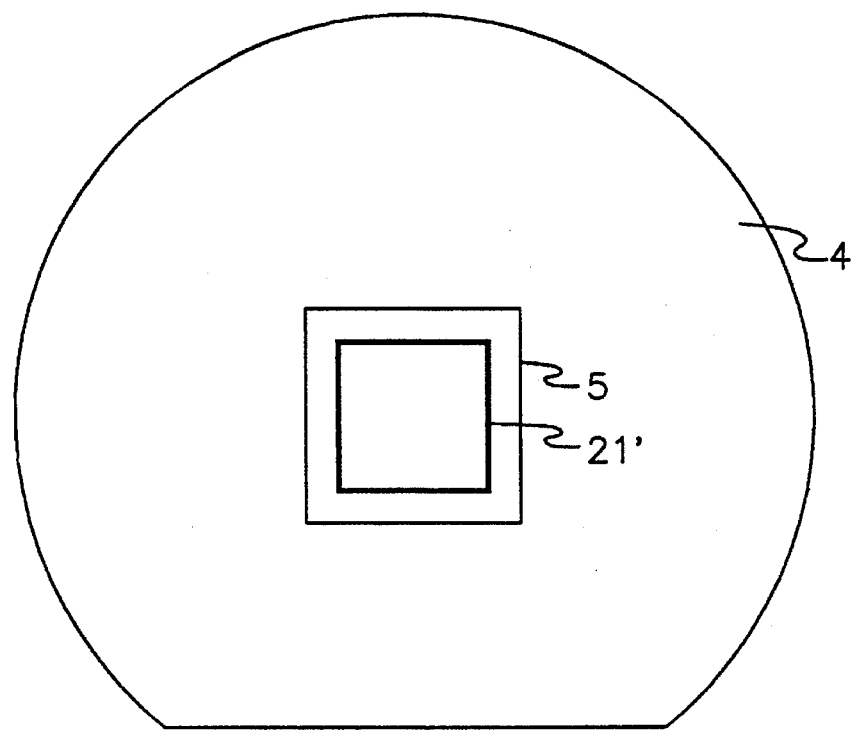
FIGS. 3A and 3C are plan views showing a method for detecting a setting error of the blind of a stepper according to the present invention.
Figure 3B:
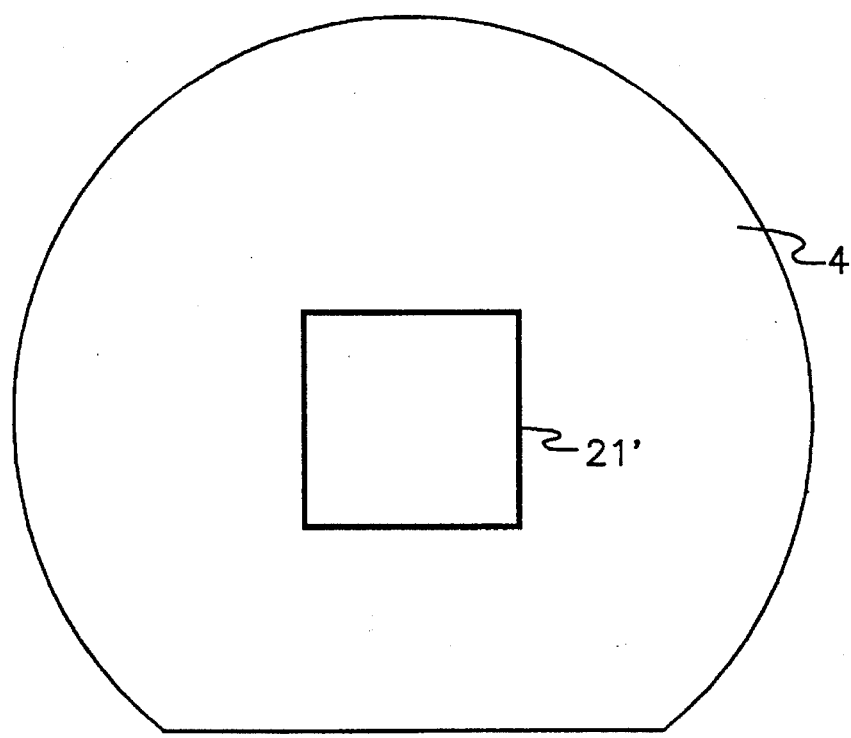
FIG. 3B is a plan view showing a linear pattern, which is generated by exactly setting the blind of a stepper, according to the present invention.
Figure 3C:
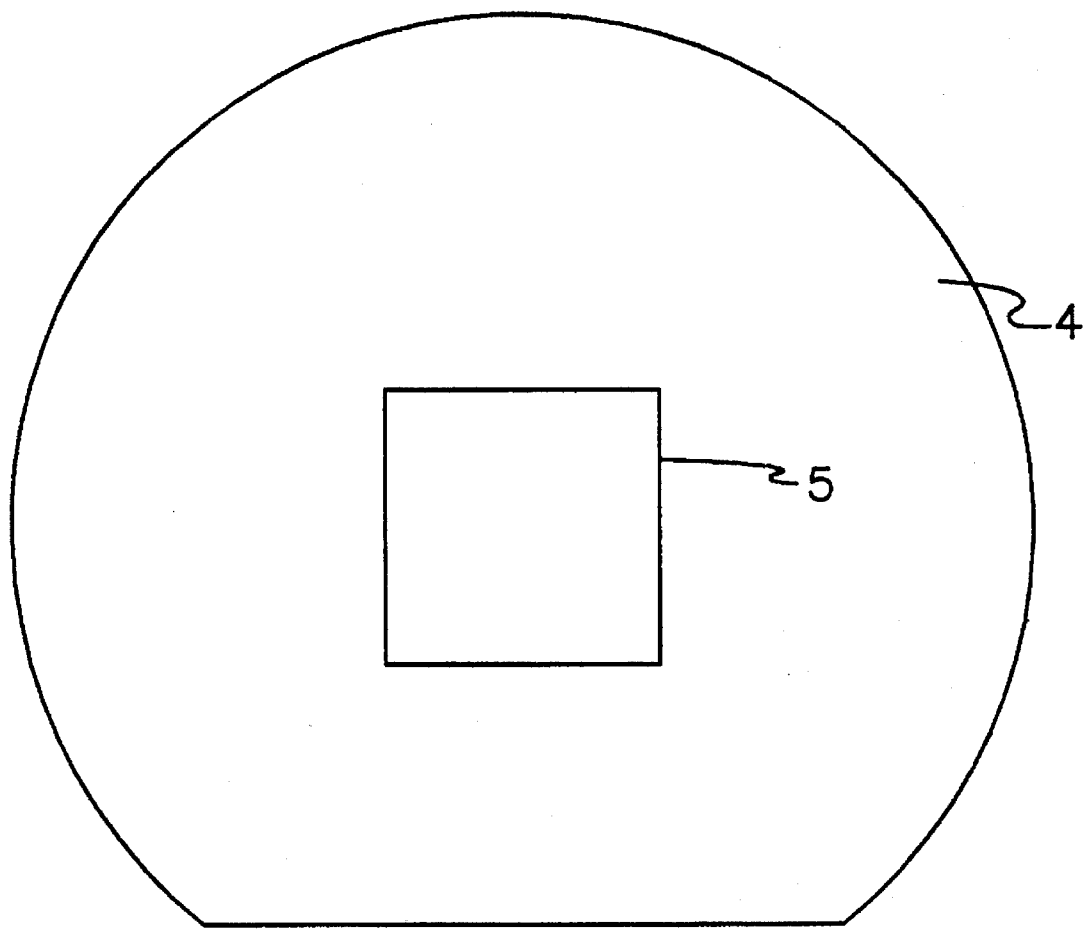

FIGS. 3A to 3C show the patterns formed by the reticle and the blind. Also, in FIGS. 3A and 3B, one of the chrome patterns 21 and 22 shown in FIG. 2 is shown that is, the chrome pattern 21' or 22' is shown only for simplification of this explanation.

A linear pattern 5 and the linear patterns 21' and 22' are made by a process of depositing the photoresist layer, setting the reticle and the blind of the stepper, exposing the photoresist layer, and developing the photoresist layer, respectively.

As shown in FIG. 3A, when the actual setting value of the blind is smaller than the expected setting value, the linear pattern 5 formed by the blind and the linear pattern 21' formed by the reticle, are both developed on the wafer. That is, the blind setting error is detected by observing the two linear patterns.

Also, as shown in FIG. 3B, if the linear pattern 5, formed by the blind, corresponds to the linear pattern 22 formed by the reticle, it shows that the setting of the blind is correct. Accordingly, the manufacturer can detect the blind setting accuracy with the linear patterns without vernier.

Furthermore, as shown in FIG. 3C, when the setting of the blind shield exposes too much light, images of the patterns 21, 22, and 23 are not shown on the wafer.

As described above, the present invention has an effect whereby a setting error can be easily measured by observing only the linear patterns formed on the wafer without observing verniers.

What is claimed is:

1. A method for measuring the setting error of a blind of a stepper, said blind having a shape, comprising the steps of:

providing said blind and a reticle having a linear pattern, said linear pattern having the same shape as is formed by said blind;

setting the reticle and the blind to expose a photoresist layer so that one of a first case and a second case occur, said first case occurring when a first pattern formed by the blind and a second pattern formed by the reticle are apparent when the photoresist is developed, said second case occurring when light passing through the blind overexposes the photoresist and the second pattern is not shown the photoresist is developed;

observing the photoresist when developed to distinguish which of the first and second cases has occurred and in the first case, measuring the setting error of said blind from any difference in size between said first pattern and said second pattern to obtain blind setting error.

2. The method in accordance with claim 1, wherein said linear pattern has a square shape.

3. The method in accordance with claim 1, wherein said linear pattern of said reticle has width of 10 µm to 200 µm.

4. A method for measuring the setting error of a blind of a stepper, said blind having a shape, comprising the steps of:

providing said blind and a reticle having a plurality of linear patterns, said linear patterns having the same shape as is formed by said blind;

setting the reticle and the blind to expose a photoresist layer so that one of a first case and a second case occur, said first case occurring when a first pattern formed by the blind and second patterns formed by the reticle are apparent when light passing photoresist is developed, said second case occurring when light passing through the blind overexposes the photoresist and the second patterns are not shown when the photoresist is developed;

observing the photoresist when developed to distinguish which of the first and second cases has occurred and in the first case, measuring the setting error of said blind from any difference in size between said first pattern and one of said second patterns to obtain blind setting error.

5. The method in accordance with claim 4, wherein said linear patterns have a square shape.

6. The method in accordance with claim 4, wherein said linear patterns have a width of 10 µm to 200 µm.

* * * * *